US012650476B1

(12) United States Patent

Young et al.

(10) Patent No.: US 12,650,476 B1

(45) Date of Patent: Jun. 9, 2026

(54) SYSTEM AND METHOD OF EMULATING ELECTRICAL POWER ISLAND

(71) Applicant: Keysight Technologies, Inc., Santa Rosa, CA (US)

(72) Inventors: Paul Young, Budd Lake, NJ (US); Mark Peffley, Budd Lake, NJ (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 431 days.

(21) Appl. No.: 18/227,579

(22) Filed: Jul. 28, 2023

(51) Int. Cl.
*G01R 31/42* (2006.01)
*H02J 3/388* (2026.01)

(52) U.S. Cl.
CPC .............. *G01R 31/42* (2013.01); *H02J 3/388* (2020.01)

(58) Field of Classification Search
CPC ................................. G01R 31/42; H02J 3/388
See application file for complete search history.

(56) References Cited

U.S. PATENT DOCUMENTS

2018/0164367 A1* 6/2018 Zheng ................ G01R 31/2827

FOREIGN PATENT DOCUMENTS

| CN | 108008253 | A | 5/2018 |
| CN | 112578217 | B | 3/2021 |
| CN | 113419195 | A | 9/2021 |

OTHER PUBLICATIONS

"IEEE Standard for Interconnection and Interoperability of Distributed Energy Resources with Associated Electric Power Systems Interfaces", IEEE Standards Coordinating Committee 21, IEEE Std 1547™—2018, pp. 1-138.
English translation of CN112578217B, 11 pgs.
English translation of CN108008253A, 21 pgs.
English translation of CN113419195A, 14 pgs.
Xu Zaide et al. "Photovoltaic grid-connected inverter electronic anti-islanding protection test device and its application," Electric Power Automation Equipment, vol. 38, Issue 4, Apr. 2018, 6 pgs. (English translation).
"IEEE Standard Conformance Test Procedures for Equipment Interconnecting Distributed Energy Resources with Electric Power Systems and Associated Interfaces", IEEE Standards Coordinating Committee 21, IEEE Std 1547.1™—2020, pp. 1-282.

* cited by examiner

*Primary Examiner* — Walter L Lindsay, Jr.
*Assistant Examiner* — Geoffrey T Evans

(57) ABSTRACT

A system and method test sustained and anti-islanding capabilities of EUT, where a power island is sustained without anti-islanding functionality and becomes de-energized with anti-islanding functionality. The method includes applying grid voltage to the EUT to obtain measurement current from the EUT; calculating RLC component values of a programmable RLC filter from measurement current and source voltage, including calculating target gain and phase, calculating target R, L and C parameters using the target gain and phase, and translating the target R, L and C parameters to physical parameters; applying the physical parameters and the measurement current to the programmable RLC filter to obtain RLC voltage; comparing the RLC voltage to source voltage; and when the RLC voltage is substantially the same as the source voltage, predicting that transition to a power island with the applied RLC component values will be sufficiently smooth to avoid triggering system protections of the EUT.

20 Claims, 8 Drawing Sheets

300

$Z_{RLC}(s)$ 330     310     320

C     R     L

410

$I_{MEAS}(t)$ → Real-time $Z_{RLC}$ Filter → $V_{RLC}(t)$

'Program' Filter Parameters

415

Translation to Physical Parameters
e.g. potentiometer setting,
digital filter coefficients, etc Calculated $\{R_{GAIN}, F_{CORNER}, Q\}$
or $\{R, L, C\}$

SYSTEM AND METHOD OF EMULATING ELECTRICAL POWER ISLAND

BACKGROUND

Distributed Energy Resources (DER) produce electrical power and are generally installed on-site at homes and businesses where the electricity is used. DERs decentralize production of electricity and complement traditional utilities, such as power plants and associated grid distribution systems. Examples of DERs are solar photovoltaic and wind turbine systems, which may include batteries for storing electricity to shift when consumers pull power from the electrical grid. Excess electricity generated by DERs may be returned to the electrical grid, where it may be consumed at other locations.

Because the electrical grid provides alternating current (AC) electricity, and DERs generate direct current (DC) electricity, DERs include DC/AC inverters for converting the generated DC electrical power to AC electrical power when providing electricity to the electrical grid. Generally, DC/AC inverters of the DERs must meet rigorous electrical standards regarding how they will behave during normal and abnormal conditions of the electrical grid. This testing is typically done using grid emulators, which are able to provide repeatable voltages and frequencies specific to any of geographical regions and fault conditions. One common electrical standard is IEEE Std 1547-2018, IEEE Standard for Interconnection and Interoperability of Distributed Energy Resources with Associated Electric Power Systems Interfaces (© 6 Apr. 2018). IEEE Std 1547-2018 requires testing the ability of a DC/AC inverter to detect and de-energize an unintentionally formed "power island," which is a real-world scenario in which the DC/AC inverter (or set of DC/AC inverters) becomes disconnected from the electrical grid (voltage generation) but remains connected to nearby loads that happen to be drawing the same amount of power that the DC/AC inverter is producing. Under the right set of conditions, the DC/AC inverter will continue to export energy from the DER to the nearby loads, thereby creating a locally energized, unregulated electrical grid over which the utility has no control. This is a dangerous and potentially destructive condition.

To prevent unintentional formation of power islands, the IEEE Std 1547-2018 requires that DC/AC inverters for DERs be designed with specific anti-islanding functionality. In particular, the DC/AC inverter must be able to detect and eliminate a power island in no more than 2 seconds. The compliance test procedure for this anti-islanding functionality, which is the focus of the embodiments described below, is defined in IEEE Std 1547.1-2020. There are two stages to this compliance test procedure for a given inverter Equipment Under Test (EUT). The first stage is the sustained or stable island test. Validating the anti-islanding functionality paradoxically requires first demonstrating the compliance test setup's ability to form a stable power island with the EUT. This is to avoid a false sense of compliance if there is an inadequate setup which would otherwise not be evident. The anti-islanding functionality in the EUT must be disabled by the manufacturer in this demonstration. A power island is deemed stable by IEEE Std 1547-2018 when it persists in steady state for at least 10 seconds, which is long enough to ensure confidence in the test compliance configuration. The second stage is the true compliance test for the EUT. The anti-islanding functionality in the EUT is re-enabled (offline), and the conditions for generating the stable power island are recreated in a new run. Compliance is met only when the EUT is able to detect and de-energize this otherwise stable (were it not for the anti-islanding algorithm) power island in less than 2 seconds. Replicating such an island condition with a grid emulator in a compliance test environment, whether it be to form a stable power island or to verify the anti-islanding functionality, is difficult and time-consuming for test agencies and manufacturers DC/AC inverters.

In addition to the grid emulator, island testing requires high power resistor, inductor, and capacitor (RLC) elements that must be precisely tuned for each test, so that the active and reactive power consumed by the RLC elements matches that produced by the DC/AC inverter, resulting in near zero power to the grid. A poor match between the consumed power of the RLC elements and that produced by the DC/AC inverter will cause transients or drift in voltage or frequency once the power island is formed. The intent of the standard is to capture the worst-case scenario where creation of the power island results in no noticeable change in voltage or frequency. Newly mandated grid support functions tend to exacerbate the drift in voltage and frequency as it creates additional coupling between voltage, frequency, and mismatched real and reactive power. Once the island forms, these grid support functions further alter the operating point, increase the match error, and result in positive feedback that potentially causes the power island to fail the 10 second stability demonstration. A good initial match is essential to preventing this chain reaction.

The grid support, anti-islanding test cases highlight the difficulty achieving sufficient accuracy with manual tuning of the RLC elements. Once the 10 second island has been demonstrated, the compliance setup has been validated. The compliance test is then run with the anti-islanding functionality in the EUT enabled, where the RLC tuning/island creation procedure is repeated over many iterations to test the ability of the EUT to detect and de-energize the power islands. The tedious tuning process must be performed under numerous different test conditions, each of which must be repeated several times with small incremental variations to ensure the worst-case island detection time has been identified. It may take several days to complete the unintentional islanding tests for a single product due to the inherent difficulties of the conventional testing procedures. In addition, the test process is arduous enough that most manufacturers lack the in-house capability to perform anti-islanding pre-qualification before submitting products to commercial test labs, compounding the test time burden.

SUMMARY

According to a representative embodiment, a method is provided for testing sustained and anti-islanding capabilities of equipment under test (EUT), where the EUT is a DC/AC inverter configured to interface a distributed energy resource (DER) with an electrical grid, where the EUT energizes a power island when the EUT becomes disconnected from the electrical grid but remains connected to at least one local load drawing the same amount of power being produced by the EUT, and where the power island is sustained for a predetermined minimum time period without anti-islanding functionality in the EUT or becomes de-energized within a predetermined maximum time period with the anti-islanding functionality in the EUT. The method includes applying grid voltage ($V_{GRID}$) to the EUT in a voltage source mode to obtain measurement current ($I_{MEAS}$) from the EUT, where the grid voltage ($V_{GRID}$) emulates the electrical grid; and automatically calculating RLC component values of a programmable RLC filter from at least the measurement current ($I_{MEAS}$) and source voltage ($V_{SOURCE}$), where calculating the RLC component values includes calculating target gain and target phase of the programmable RLC filter; calculating target R, L and C parameters of the RLC filter using the target gain and the target phase of the programmable RLC filter, where the RLC component values are equal to the R, L and C parameters; and translating the target R, L and C parameters to physical parameters compatible with the RLC filter. The method further includes applying the physical parameters and the measurement current ($I_{MEAS}$) to the programmable RLC filter to obtain RLC voltage ($V_{RLC}$); comparing the RLC voltage ($V_{RLC}$) to the source voltage ($V_{SOURCE}$); when the RLC voltage ($V_{RLC}$) is substantially the same as the source voltage ($V_{SOURCE}$), predicting that a subsequent transition to a power island energized by the EUT with the RLC filter with the applied RLC component values will be sufficiently smooth to avoid triggering system protections of the EUT against abnormal voltage, current and/or frequency conditions; applying the RLC voltage ($V_{RLC}$) to the EUT in an island mode to energize the power island; and testing an ability of the EUT to sustain the power island for the predetermined minimum time period with the anti-islanding functionality disabled and/or to detect and de-energize the power island within the predetermined maximum time period when the anti-islanding functionality is enabled.

According to another representative embodiment, a system is provided for testing sustained and anti-islanding capabilities of EUT, where the EUT is a DC/AC inverter configured to interface a DER with an electrical grid, where the EUT energizes a power island when the EUT becomes disconnected from the electrical grid but remains connected to at least one local load drawing the same amount of power being produced by the EUT, and where the power island is sustained for a predetermined minimum time period without anti-islanding functionality in the EUT or becomes de-energized within a predetermined maximum time period with the anti-islanding functionality in the EUT. The system includes a programmable RLC filter, an AC voltage source, and a controller. The RLC filter is configured to provide an RLC voltage ($V_{RLC}$). The AC voltage source configured to generate grid voltage ($V_{GRID}$), where the grid voltage ($V_{GRID}$) emulates the electrical grid to the EUT. The controller includes a processing unit and a non-transitory memory storing instructions that, when executed by the processing unit, cause the processing unit to obtain measurement current ($I_{MEAS}$) from the EUT with in a voltage source mode for applying the grid voltage ($V_{GRID}$) to the EUT; and automatically calculate RLC component values of the programmable RLC filter from at least the measurement current ($I_{MEAS}$) and source voltage ($V_{SOURCE}$), where calculating the RLC component values includes calculating target gain and target phase of the programmable RLC filter; calculating target R, L and C parameters of the RLC filter using the target gain and the target phase of the programmable RLC filter, where the RLC component values are equal to the R, L and C parameters; and translating the target R, L and C parameters to physical parameters compatible with the RLC filter. Executing the instructions further cause the processing unit to apply the physical parameters and the measurement current ($I_{MEAS}$) to the programmable RLC filter to obtain the RLC voltage ($V_{RLC}$); compare the RLC voltage ($V_{RLC}$) to the source voltage ($V_{SOURCE}$); when the RLC voltage ($V_{RLC}$) is substantially the same as the source voltage ($V_{SOURCE}$), predict that a subsequent transition to a power island energized by the EUT with the RLC filter having the applied RLC component values will be sufficiently smooth to avoid triggering system protections of the EUT against abnormal voltage, current and/or frequency conditions; apply the RLC voltage ($V_{RLC}$) to the EUT in an island mode for energizing the power island; and test an ability of the EUT to sustain the power island for the predetermined minimum time period with the anti-islanding functionality disabled or to detect and de-energize the power island within the predetermined maximum time period when the anti-islanding functionality is enabled.

According to a representative embodiment, a non-transitory computer readable medium storing instructions for testing sustained and anti-islanding capabilities of EUT, where the EUT is a DC/AC inverter configured to interface a DER with an electrical grid, where the EUT energizes a power island when the EUT becomes disconnected from the electrical grid but remains connected to at least one local load drawing the same amount of power being produced by the EUT, and where the power island is sustained for a predetermined minimum time period without anti-islanding functionality in the EUT or becomes de-energized within a predetermined maximum time period with the anti-islanding functionality in the EUT. When executed by a processing unit, the instructions cause the processing unit to obtain measurement current ($I_{MEAS}$) from the EUT in a voltage source mode in which grid voltage ($V_{GRID}$) generated by an AC voltage source is applied to the EUT for emulating the electrical grid, wherein the grid voltage ($V_{GRID}$) emulates the electrical grid; and automatically calculate RLC component values of a programmable RLC filter, configured to output an RLC voltage, from at least the measurement current ($I_{MEAS}$), where automatically calculating the RLC component values includes calculating target gain and target phase of the programmable RLC filter; calculating target R, L and C parameters of the RLC filter using the target gain and the target phase of the programmable RLC filter, where the RLC component values are equal to the R, L and C parameters; and translating the target R, L and C parameters to physical parameters compatible with the RLC filter. The instructions further cause the processing unit to apply the physical parameters and the measurement current ($I_{MEAS}$) to the programmable RLC filter to obtain the RLC voltage ($V_{RLC}$); compare the RLC voltage ($V_{RLC}$) to a source voltage ($V_{SOURCE}$); when the RLC voltage ($V_{RLC}$) is substantially the same as the source voltage ($V_{SOURCE}$), predict that a subsequent transition to a power island energized by the EUT with the RLC filter having the applied RLC component values will be sufficiently smooth to avoid triggering system protections of the EUT against abnormal voltage, current and/or frequency conditions; and switch to an island to apply the RLC voltage ($V_{RLC}$) to the EUT for energizing the power island, where an ability of the EUT to sustain the power island for the predetermined minimum time period with the anti-islanding functionality disabled or to detect and de-energize the power island within the predetermined maximum time period when the anti-islanding functionality is enabled is tested in the island mode.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
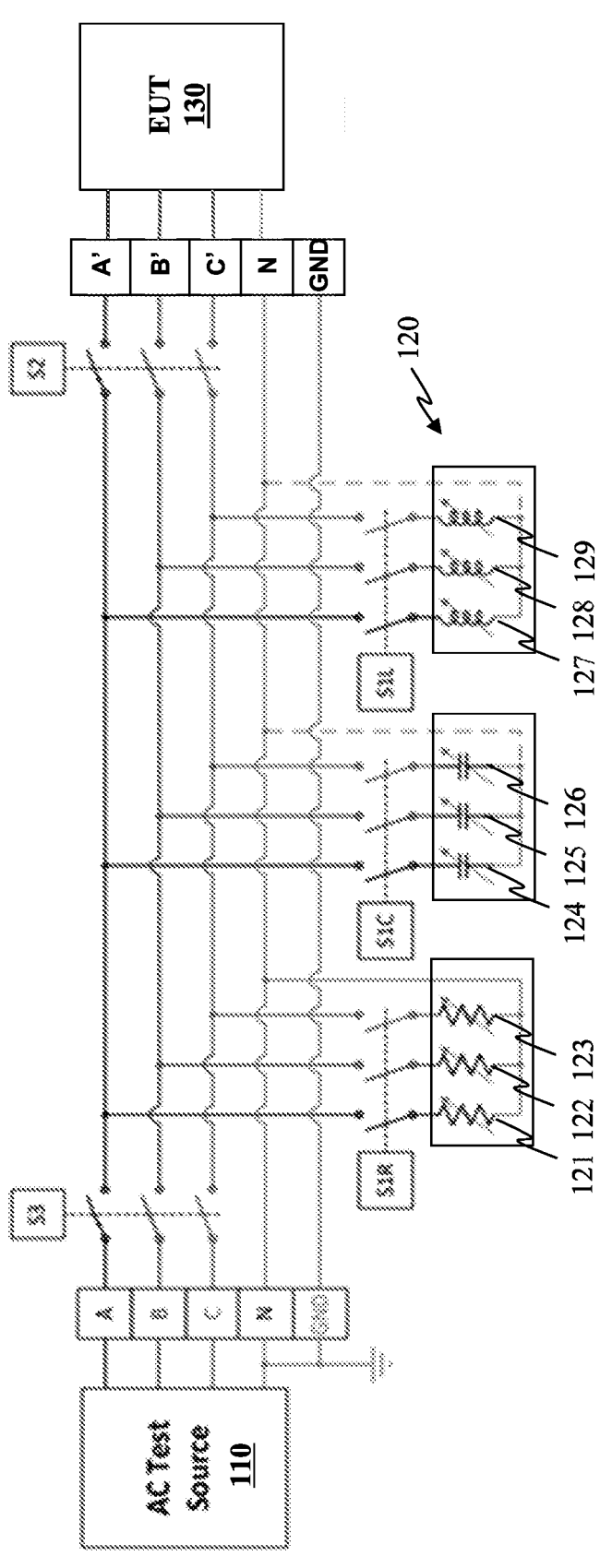
FIG. 1 is a simplified schematic from IEEE Std 1547.1-2020 showing a standard system for testing anti-islanding capability of equipment under test (EUT), including a DC/AC inverter configured to interface a distributed energy resource (DER) with an electrical grid.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

FIG. 1 is a simplified circuit from IEEE Std 1547.1-2020 showing a standard test system for setting up a power island to create an unintentional islanding test configuration.

Referring to FIG. 1, test system 100 includes AC test source 110, which is a voltage source configured to output AC voltage that simulates an electrical grid. In the depicted example, the AC test source 110 generates three-phase electrical voltage, indicated by terminals A, B and C, configured to carry voltage signals that are 120 degrees phase shifted relative to one another. The terminals A, B and C are selectively connected to corresponding power lines 111, 112 and 113 by supply switches S3, respectively, and the power lines 111, 112 and 113 are selectively connected to corresponding EUT terminals A', B' and C' of EUT 130 by EUT switches S2, respectively. The EUT 130 may be a DC/AC inverter configured to interface a distributed energy resource (DER) (not shown) with the simulated electrical grid, such as solar photovoltaic or wind turbine system, for example.

The test system 100 further includes RLC circuit 120, which includes a set of tunable resistors 121, 122 and 123, a set of tunable capacitors 124, 125 and 126, and a set of tunable inductors 127, 128 and 129. The tunable resistors 121, 122 and 123 have adjustable resistance (R) values and are selectively connected to the power lines 111, 112 and 113 by resistance switches S1R, respectively. The tunable capacitors 124, 125 and 126 have adjustable capacitance (C) values and are selectively connected to the power lines 111, 112 and 113 by capacitor switches S1C, respectively. The tunable inductors 127, 128 and 129 have adjustable inductance (L) values and are selectively connected to the power lines 111, 112 and 113 by inductor switches S1L, respectively. A conventional unintentional islanding test process includes iteratively adjusting the different R, L and C values of the RLC circuit 120 for each phase of the three-phase electrical voltage, and measuring the current through the supply switches in S3 at each iteration until the current through the terminals A, B and C at the supply switches S3 is at or near zero, indicating that the entirety of the current from the EUT 130 is flowing into the island load.

As mentioned above, establishing a sufficiently stable power island to test anti-islanding capabilities using conventional techniques requires a tedious, essentially trial and error tuning process repeatedly performed under different test conditions with small incremental variations. Other disadvantages include unwanted setpoint interactions, in that the RLC component values of the RLC circuit 120 are inherently coupled by parasitic effects such as dissipation in the inductor or inductance in the resistor, such that adjusting one of the RLC component values requires readjusting the others to maintain the matching of voltage, frequency, and phase. This iterative process is time consuming and must be repeated for each phase. IEEE Std 1547-2018 specifies tuning the RLC circuit 120 until less than 2 percent threshold of the initial RMS current ($I_{RMS}$) flows through supply switches S3 (where zero current indicates a perfect match). However, even this level of matching error results in poor repeatability and may cause significant transients when islanding.

Also, there are disruptions caused by inadvertent triggering of protection systems. That is, independent of island detection, the EUT 130 generally includes system protections for abnormal voltage, current and frequency conditions. Transitioning power of the EUT 130 from a grid simulator into the island load may cause a transient that triggers the system protections, thereby interrupting the test. To avoid triggering the system protections, the power transition must be sufficiently smooth, which requires determining RLC component values that precisely match voltage, frequency, and phase of the power flowing into the grid simulator before opening the supply switches S3.

Additional disruptions may be caused by inadvertent activation of grid support functions. That is, the IEEE Std 1547-2018 prescribes several islanding tests with grid support functions enabled, which causes the EUT 130 to react to deviations from nominal Vrms and frequency with significant changes to active or reactive power output. For example, the most aggressive Volt-Watt grid support curve specifies 44 percent change in reactive power for a 2 percent change in voltage. Any transient or error in matching may trigger these functions, thereby upsetting the balance of the power island and causing the test to end prematurely.

Making accurate phase measurements using the conventional testing procedures is also particularly difficult. The RLC component values of the RLC circuit 120 may be computed from Vrms, Irms, frequency and V/I phase measurements. The Vrms, Irms and frequency values may be easily measured by averaging over several line cycles to reduce noise and improve accuracy. However, making accurate V/I phase measurements is difficult on time domain instruments, such as an oscilloscope, for example, due to harmonics, switching converter ripple, zero crossing distortion, and other noise. Inaccurate V/I phase measurements are particularly problematic because they directly affect accuracy of the frequency match, discussed above, and the allowed operating frequency range of the EUT 130 is typically narrow.

Even when accurate island RLC component values are known, setting up the load is challenging due to non-idealities in physical RLC components. Real world power RLC components have large tolerances, drift with temperature, and vary with operating point, necessitating time consuming iterative tuning. The RLC components are also physically large, expensive, and dissipate substantial power. Although rheostats and variable reactors may be adjusted, EUTs of widely differing power require different RLC banks because there is a limited practical range of values over which any single set is able to be tuned. Also, physically large RLC components have substantial parasitics, such as inductance in power resistors and resistance in power inductors, for example. The parasitics must be known and complicate the otherwise simple calculations for modeling the RLC components. Some approaches replace physical RLC components with Power Hardware In the Loop (PHIL) or a programmable electronic load to mitigate these issues. However, even with programmable solutions, tedious manual fine tuning of a matching process is still required in the present state of the art.

According to various embodiments, conditions required to achieve a power island that is sufficiently stable to accommodate anti-islanding testing of a DC/AC inverter (EUT) are automatically determined using an algorithm executed by one or more processors. Generally, the algorithm measures electrical operating conditions of the EUT, including voltage, current, frequency and phase. These measurements are used to compute impedance ($Z_{RLC}$) at the components that exactly consume the active and reactive power of the EUT. Results are verified by simulating virtual impedance or by adding the specified R, L and C values to the line. The measurements and a programmable RLC circuit (filter) may be combined with the grid simulator or may be provided by separate instrument(s). Drift or errors in measurement may be detected and corrected before committing to enter the island state for subsequent anti-islanding testing.

Figure 2:
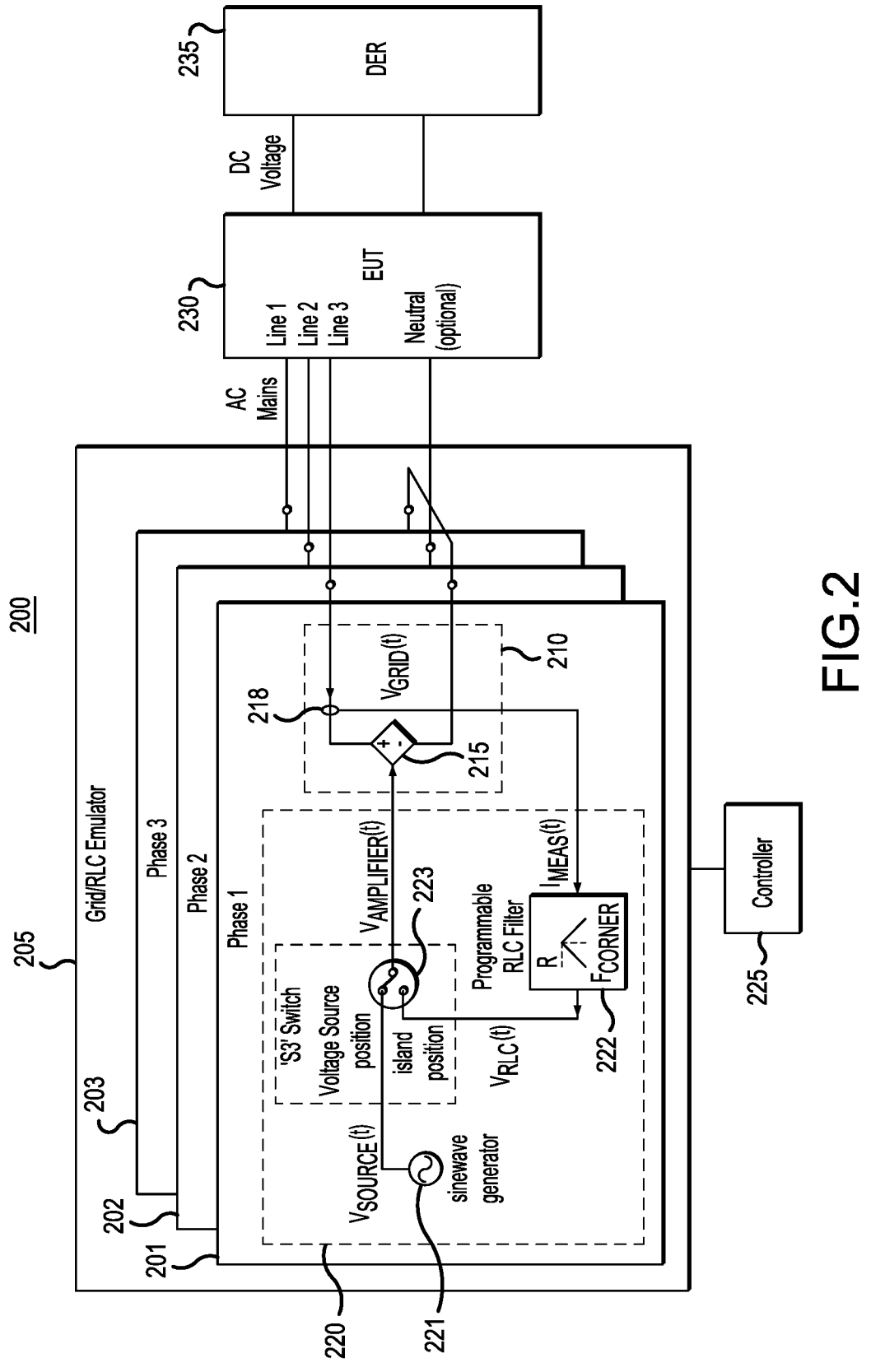
FIG. 2 is a simplified block diagram showing a system for enabling testing of sustained island capability and anti-islanding capability of an EUT, including a DC/AC inverter configured to interface a DER with an emulated electrical grid/RLC circuit, according to a representative embodiment.

FIG. 2 is a simplified block diagram showing a system for enabling testing of sustained island capability and anti-islanding capability of an EUT, such as a DC/AC inverter configured to interface a DER with an emulated electrical grid/RLC circuit, according to a representative embodiment.

Referring to FIG. 2, system 200 includes a grid/RLC emulator 205 for emulating three-phase electrical voltage for testing EUT 230, including sustained island and anti-islanding testing. The EUT 230 may be a DC/AC inverter connected to DER 235 for converting the DC electrical power generated by the DER 235 to AC electrical power when providing electricity to the electrical grid. The emulated grid is a three-phase power grid with line circuits 201, 202 and 203 corresponding to the three phases, Phase 1, Phase 2 and Phase 3, respectively. For the sake of convenience, only the portions of the system 200 associated with Phase 1 are described below, although it is understood that the portions of the system 200 associated with Phases 2 and 3 are substantially the same. It is further understood that the discussion below applies to a one-phase (e.g., Phase 1) emulated power grid.

Referring to Phase 1, the grid/RLC emulator 205 includes electrical circuit 210 and control circuit 220 configured to control operation the electrical circuit 210. The electrical circuit 210 includes AC voltage source 215, which is configured to emulate the electrical grid in a test environment, and a current transducer 218. The AC voltage source 215 is configured to output an AC grid voltage $V_{GRID}$ under control of the control circuit 220. The AC voltage source 215 may provide one phase of the three-phase electrical power, as discussed above. The AC voltage source 215 may include a power amplifier configured to adjust the AC voltage signal to a desired amplitude and phase, in response to an amplifier control signal $V_{AMPLIFIER}$ output by the control circuit 220, to provide the grid voltage $V_{GRID}$. The amplifier control signal $V_{AMPLIFIER}$ may be a digital signal or a low voltage analog signal, for example. The grid voltage $V_{GRID}$ output by the AC voltage source 215 is applied to the EUT 230, resulting in measurement current $I_{MEAS}$, which is provided to the control circuit 220 via the current transducer 218.

The control circuit 220 includes a signal source 221, such as a sinewave generator, for example, configured to provide a predetermined source voltage signal $V_{SOURCE}$, and a programmable RLC filter 222 configured to provide an RLC voltage $V_{RLC}$, which is determined in response to the measurement current $I_{MEAS}$ received from the electrical test circuit 210. The control circuit 220 further includes a switch 223 configured to switch between the source voltage $V_{SOURCE}$ in a voltage source mode and the RLC voltage $V_{RLC}$ in an island mode, as discussed below. The selected one of the source voltage $V_{SOURCE}$ and the RLC voltage $V_{RLC}$ is output by the switch 223 as the amplifier control signal $V_{AMPLIFIER}$ to the AC voltage source 215. Operation of the switch 223, as well as initial settings of the signal source 221 and parameter settings of the RLC filter 222, are controlled by a controller 225, and example of which is described in more detail below with reference to FIG. 8.

The RLC filter 222 is implemented by an analog or digital filter which has a parameterized transfer function that mimics the impedance transfer function of the desired RLC circuit to be emulated. Because the output of RLC filter 222 generates a real-time voltage in the power amplifier directly resulting from the measurement by the current transducer 218 in the same power amplifier, the resulting current-to-voltage characteristic at the power amplifier terminals is an impedance with a transfer function directly proportional to that of the RLC filter 222.

Figure 3:
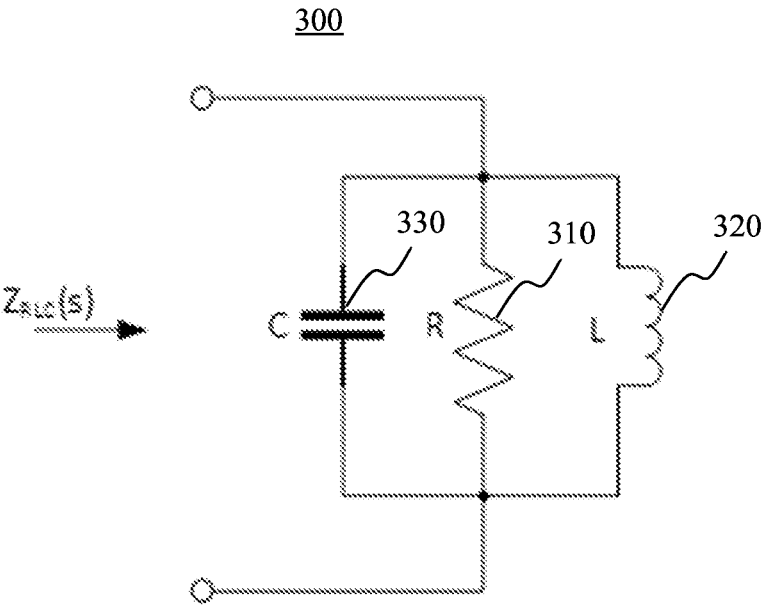
FIG. 3 is a simplified block diagram showing an RLC circuit, according to a representative embodiment.

An example of a desired RLC filter circuit to emulate is shown in FIG. 3. Referring to FIG. 3, model RLC circuit 300 includes representative resistance 310, inductance 320 and capacitance 330 connected in parallel. The RLC circuit 300 impedance is defined by $Z_{RLC}(s)$ across the electrical terminals. The impedance $Z_{RLC}(s)$ may be expressed as a transfer function in Laplace domain, indicated by Equation (1), where s is the complex frequency:

$$Z_{RLC}(s) = \frac{s*[1/C]}{s^2 + s*\left[\frac{1}{R*C}\right] + \left[\frac{1}{L*C}\right]} \tag{1}$$

The same transfer function may be expressed equivalently in terms of parameters of interest in the intended range of applications, as shown in Equation (2), where the parameters of interest include scale factor $R_{GAIN}$, resonant frequency $F_{CORNER}$, and quality factor Q:

$$Z_{RLC}(s) = R_{GAIN} * \frac{s*[2\pi*F_{CORNER}/Q]}{s^2 + s*[2\pi*F_{CORNER}/Q] + 4\pi^2*F_{CORNER}^2} \tag{2}$$

where:

$$Q = R*\sqrt{\frac{C}{L}}$$

$$F_{CORNER} = \frac{1}{2\pi\sqrt{L*C}}$$

$$R_{GAIN} = R$$

Note that $R_{GAIN}$, $F_{CORNER}$, and Q are an equivalent (and more mathematically convenient) set of parameters to R, L and C for describing the RLC circuit 300 (and thus the RLC filter 222). Once $R_{GAIN}$, $F_{CORNER}$, and Q are calculated, the solution may be translated back to R, L, and C domain according to Equations (3A), (3B) and 3C):

$$R = R_{GAIN} \tag{3A}$$

$$L = \frac{R_{GAIN}}{2\pi*F_{CORNER}*Q} \tag{3B}$$

$$C = \frac{Q}{2\pi*F_{CORNER}*R_{GAIN}} \tag{3C}$$

$R_{GAIN}$ and $F_{CORNER}$ are the only two degrees of freedom required for determining a sufficient match between the RLC voltage $V_{RLC}$ and the source voltage $V_{SOURCE}$, discussed below. The quality factor Q is typically treated as a fixed input, although there are conceivable scenarios in which the quality factor Q would also need to be adjustable.

The matching process determines the $R_{GAIN}$, $F_{CORNER}$, and Q parameters (or the R, L and C parameters) to apply to the RLC filter 222. The matching process is concerned with phasor quantities at fundamental grid or line frequency $F_{LINE}$. Equation (4) provides the expected form of the AC grid voltage $V_{GRID}$, which is defined as a sinusoidal waveform with zero absolute phase for purposes of explanation.

$$V_{GRID}(t)=|V_{GRID}|*\cos(2\pi*F_{LINE}*t) \tag{4}$$

For purposes of explanation, the grid voltage $V_{GRID}$ may be treated as having zero phase for the convenience of defining all waveforms discussed herein relative to zero phase. For the sake of the phasor measurements, discussed below, the absolute phase reference does not matter.

General forms of sinusoidal components of the measurement current $I_{MEAS}$ and the RLC voltage $V_{RLC}$ expected at the input and output of the RLC filter 222, respectively, are provided by Equations (5) and (6):

$$I_{meas}(t)=|I_{MEAS}|*\cos(2\pi*F_{LINE}*t+\theta_I) \tag{5}$$

$$V_{RLC}(t)|I_{MEAS}|*|Z_{RLC}|*\cos(2\pi*F_{LINE}*t+\theta_I+\theta_{RLC}) \tag{6}$$

$|I_{MEAS}|$ and $\theta_I$ are amplitude and phase (relative to the grid voltage $V_{GRID}$), respectively, of the measured current waveform at the electrical terminals. $|Z_{RLC}|$ and $\theta_{RLC}$ are physical gain and phase, respectively, of the filter transfer function at the fundamental line frequency $F_{LINE}$. As an example, for the simple transfer function example defined in Equation (2), $|Z_{RLC}|$ and $\theta_{RLC}$ may be mathematically expressed as Equations (7) and (8), respectively:

$$|Z_{RLC}| = \frac{R_{GAIN}*F_{LINE}*F_{CORNER}}{\sqrt{Q^2*(F_{CORNER}^2 - F_{LINE}^2) + (F_{LINE}*F_{CORNER})^2}} \tag{7}$$

$$\theta_{RLC} = \frac{\pi}{2} + \text{atan}\left(\frac{F_{LINE}}{F_{zero}}\right) - \text{atan2}\left(\frac{F_{LINE}*F_{CORNER}}{Q}, F_{CORNER}^2 - F_{LINE}^2\right) \tag{8}$$

In Equation (8), in particular, atan2 is a two argument form of atan commonly used in programming and scripting languages, where atan2 allows for calculation of an unambiguous angle given any two coordinates in the x, y plane. In this example, the syntax is atan2(y, x), which corresponds to atan(y/x) when both x and y are positive.

The internal reference waveform of the source voltage $V_{SOURCE}$, provided by the signal source 221, for which the output of the $Z_{RLC}$ filter 410 is tuned may be defined by Equation (9):

$$V_{SOURCE}(t)|V_{SOURCE}|*\cos(2\pi*F_{LINE}*t+\theta_{SOURCE}) \qquad (9)$$

$|V_{SOURCE}|$ and $\theta_{SOURCE}$ are amplitude and phase (relative to the grid voltage $V_{GRID}$), respectively, of the source voltage $V_{SOURCE}$. The source voltage $V_{SOURCE}$ is provided as the amplifier control signal $V_{AMPLIFIER}$ for controlling the power stage output voltage generated by the electrical test circuit 210 prior to islanding. During the transition to islanding, voltage control will be re-routed to the output of the RLC filter 222. That is, the RLC voltage $V_{RLC}$ output by the RLC filter 222 is provided as the amplifier control signal $V_{AMPLIFIER}$ for controlling the power stage output voltage generated by the electrical test circuit 210 during the island transition.

As discussed above, the EUT 230 is a DC/AC inverter configured to interface the DER 235 with an electrical grid, one phase of which is represented by the electrical circuit 210. Generally, the system 200 is configured to test the EUT 230 for sustained island capability, according to which the EUT 230 is able to energize and sustain a stable power island for a predetermined minimum time period (e.g., 10 seconds). The system 200 is further configured to test the EUT 230 for anti-islanding capability, according to which the EUT 230 automatically de-energizes a power island within a predetermined maximum time period (e.g., 2 seconds), in response to the EUT 230 creating the power island when it becomes disconnected from the electrical grid but remains connected to one or more loads drawing the same amount of power being produced by the EUT 230.

To confirm the capability of forming a stable power island, the system 200 is initially placed in a voltage source mode, in which the controller 225 switches the switch 223 to a first position (voltage source position), such that the control circuit 220 outputs the source voltage $V_{SOURCE}$ as the amplifier control signal $V_{AMPLIFIER}$ to the AC voltage source 215 for applying the grid voltage $V_{GRID}$ to the EUT 230. The resulting measurement current $I_{MEAS}$ through the EUT 230 is coupled to the input of the RLC filter 222 via the current transducer 218.

The matching process is then performed in order to calculate the desired values of the $R_{GAIN}$ and $F_{CORNER}$ parameters of the RLC filter 222, and to translate these parameters to corresponding physical parameters to be applied to the control circuit 220. The first step of the matching process is to capture target phasors (amplitude and phase) of the measurement current $I_{MEAS}$ at the input of the RLC filter 222, and of the source voltage $V_{SOURCE}$ at the output of the signal source 221. These amplitude and phase measurements represent the quantities $|I_{MEAS}|$ and $\theta_I$ and $|V_{SOURCE}|$ and $\theta_{SOURCE}$. Notably, the difference between the values of $\theta_I$ and $\theta_{SOURCE}$ matters, not their absolute values. Any absolute phase reference may be used provided it is common between the two measurements and measured at the same frequency as the grid voltage waveform.

The second step of the matching process is to calculate target gain and target phase (target filter phasors) of the RLC filter 222 using the phasor forms of the source voltage $V_{SOURCE}$ and the measurement current $I_{MEAS}$. The matching process calculates the values of the filter parameters $F_{CORNER}$ and $R_{GAIN}$, such that the RLC voltage $V_{RLC}$ is approximately equal to the source voltage $V_{SOURCE}$ (i.e., $V_{RLC}(t){\approx}V_{SOURCE}(t)$). This condition is required to create a smooth island transition by the EUT 230 to form the power island. Since the waveforms of the RLC voltage $V_{RLC}$ and the source voltage $V_{SOURCE}$ are sinusoidal, the RLC voltage $V_{RLC}$ being approximately equal to the source voltage signal Vs is equivalent to when the amplitude and phase of the RLC voltage $V_{RLC}$ output by the RLC filter 222 equals the amplitude and phase of the source voltage $V_{SOURCE}$ (reference waveform):

$$|I_{MEAS}|*|Z_{RLC}|{\approx}|V_{SOURCE}| \qquad (10A)$$

$$\theta_I+\theta_{RLC}{\approx}\theta_{SOURCE} \qquad (10B)$$

Solving for the gain and phase of the RLC filter 222 yields the target filter phasors, which are treated as fixed values in the following steps:

$$|Z_{RLC}|{\approx}|Z_{RLC}|_{TARGET} \qquad (10C)$$

$$\theta_{RLC}{\approx}\theta_{RLC_{TARGET}} \qquad (10D)$$

where:

$$|Z_{RLC}|_{TARGET} = \frac{|V_{SOURCE}|}{|I_{MEAS}|} \qquad (10E)$$

$$\theta_{RLC_{TARGET}} = \theta_{SOURCE} - \theta_I \qquad (10F)$$

In the third step of the matching process, parameters $F_{CORNER}$ and $R_{GAIN}$ of the RLC filter 222 are calculated, where the parameters $F_{CORNER}$ and $R_{GAIN}$ correspond to R, L and C parameters of the RLC filter 222. The parameters $F_{CORNER}$ and $R_{GAIN}$ may be calculated using a deterministic approach or a successive approximation approach, for example. In the fourth step, the parameters $F_{CORNER}$ and $R_{GAIN}$ (or the R, L and C parameters) are translated to physical parameters that are applied to the RLC filter 222, as discussed above.

Figure 4:
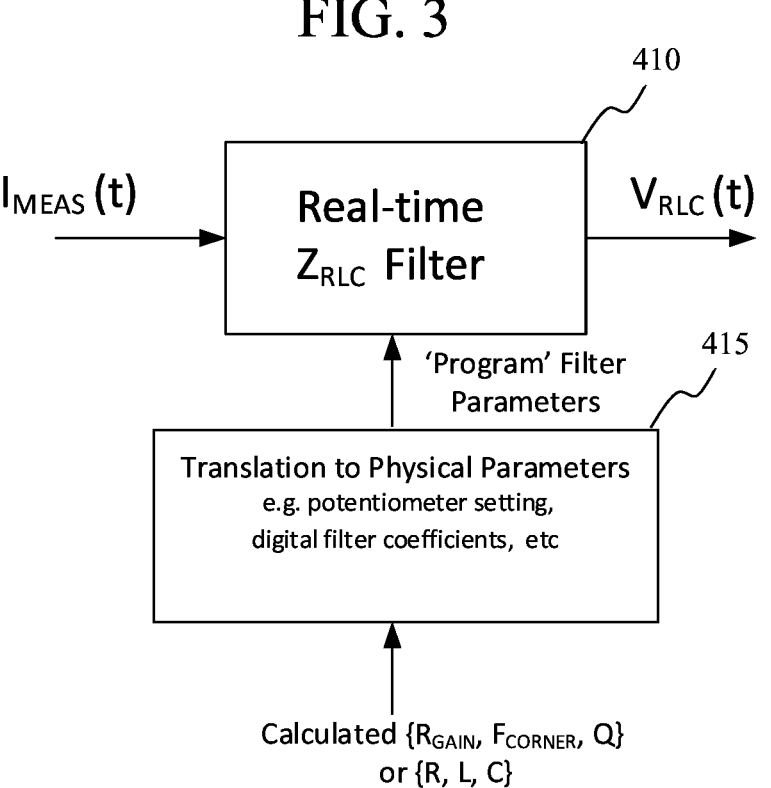
FIG. 4 is a simplified block diagram showing a representation of the $Z_{RLC}$ transfer function as a linear time-invariant filter with "programmable" parameters, according to a representative embodiment.

FIG. 4 is a simplified block diagram showing a representation of the $Z_{RLC}$ transfer function as a linear time-invariant filter with "programmable" parameters, according to a representative embodiment. Referring to FIG. 4, real-time $Z_{RLC}$ filter 410 represents the RLC filter 222. The $Z_{RLC}$ filter 410 inputs measurement current $I_{MEAS}$ and outputs RLC voltage $V_{RLC}$ in real-time, as discussed above. In addition, the $Z_{RLC}$ filter 410 inputs calculated parameters $R_{GAIN}$, $F_{CORNER}$, and Q (or R, L and C) as static parameters, which have been translated to physical parameters, such as potentiometer settings and/or digital filter coefficients, for example, by translation algorithm 415. The method for translating calculated parameters to physical parameters by the translation algorithm 415 is a known process. For example, converting Equation (2) to discrete-time or Z-domain using the bilinear transform would yield the necessary filter coefficients for a digital filter implementation. The embodiments described herein address the challenge of calculating the $R_{GAIN}$, $F_{CORNER}$, and Q parameters (or the R, L and C parameters).

In this implementation, the calculated parameters $R_{GAIN}$, $F_{CORNER}$, and Q directly translate to adjustable physical parameters that may be used to change or "program" the physical values in the $Z_{RLC}$ filter 410. The R, L and C parameters need not be directly calculated other than for reporting purposes, as a user may need a way to document the equivalent circuit parameters R, L and C used in their testing which are not otherwise directly necessary for operation. In this example, using Equation (2), the transfer function is in continuous-time domain, so it may be physically realized as an analog circuit with components that may be adjusted in an automated fashion, e.g., by the controller 225. Such components may include one or more potentiometers, for example. An equivalent discrete-time implementation, obtained through e.g. a bilinear transformation, may be realized with a real-time digital filter with adjustable coefficients, such as in an FPGA or microcontroller, for example.

According to the deterministic approach, using simple transfer function expressions (as in the following example), the parameters $F_{CORNER}$ and $R_{GAIN}$ may be analytically solved for from Equations (7) and (8), above, in terms of the target filter phasor gain and phase. The end results are shown below in equations (11) and (12):

$$F_{CORNER} = \frac{F_{LINE} * \left(1 + G_{polarity}\sqrt{1 + 4 * Q^2 * \tan\left(\frac{\pi}{2} - \theta_{RLC_{TARGET}}\right)^2}\right)}{2 * Q * \tan\left(\frac{\pi}{2} - \theta_{RLC_{TARGET}}\right)} \quad (11)$$

where $G_{polarity}$=sign $[\theta_{RLC_{TARGET}}]$ and sign[x>0]=+1 and sign[x<0]=−1.

$$R_{GAIN} = \frac{|Z_{RLC}|_{TARGET} * \sqrt{Q^2 * (F_{CORNER}^2 - F_{LINE}^2) + F_{LINE}^2 * F_{CORNER}^2}}{F_{LINE} * F_{CORNER}} \quad (12)$$

Once explicitly solved from Equation (7) and (8), Equations (11) and (12) may be implemented in software for automatic calculation of the necessary filter parameters by the controller 225.

The successive approximation approach generally may be used for more complex expressions and filter structures of the RLC filter 222, where it is not possible to find explicit analytical expressions for the filter parameters $F_{CORNER}$ and $R_{GAIN}$ using the expressions for $|Z_{RLC}|$ and $\theta_{RLC}$. This is especially true when dealing with digital filter implementations and other practical considerations of feedback systems. In this case, the successive approximation method, which may be Newton's method, for example, may be used to compute the parameters $F_{CORNER}$ and $R_{GAIN}$. The only mathematical requirements are that the expressions for $|Z_{RLC}|$ and $\theta_{RLC}$ (the equivalent of Equations (7) and (8) in the above example) can be represented, which will require detailed characterization of the implemented system.

Below is a pseudocode example of how a successive approximation approach (e.g., Newton's method) is used to calculate the filter parameters $F_{CORNER}$ and $R_{GAIN}$. The process is looped until $|Z_{RLC}|_{ERROR}$ and $\theta_{RLCERROR}$ are each sufficiently close to 0 such that the EUT 230 may smoothly transition from the grid voltage $V_{GRID}$ to the island load emulated by the RLC voltage $V_{RLC}$ to prevent triggering other system protections of the EUT 230. The filter parameters $F_{CORNER}$ and $R_{GAIN}$ are initialized, such that $F_{CORNER}$=$F_{LINE}$, $R_{GAIN}$|$Z_{RLC}|_{TARGET}$, and Q=1. Gain ($|Z_{RLC}|$) and phase ($\theta_{RLC}$) are then calculated based on present filter parameters using the determined expressions equivalent to Equations (7) and (8).

Gain error ($|Z_{RLC}|_{ERROR}$) and phase error ($\theta_{RLCERROR}$) are then calculated with respect to predetermined, fixed target values, according to Equations (13) and (14):

$$|Z_{RLC}|_{ERROR} = |Z_{RLC}|_{TARGET} - |Z_{RLC}| \quad (13)$$

$$\theta_{RLC_{ERROR}} = \theta_{RLC_{TARGET}} - \theta_{RLC} \quad (14)$$

Partial derivatives of the expressions for $|Z_{RLC}|$ and $\theta_{RLC}$ are calculated or approximated. Calculating the partial derivatives a known process, provides $$\frac{\partial |Z_{RLC}|}{\partial R_{GAIN}}, \frac{\partial |Z_{RLC}|}{\partial F_{CORNER}}, \frac{\partial \theta_{RLC}}{\partial R_{GAIN}},$$

and $$\frac{\partial \theta_{RLC}}{\partial F_{CORNER}}.$$

Using the most recent gain and phase errors determined in Equations (13) and (14) and the partial derivatives determined above, incremental changes to the filter parameters, indicated by $\Delta R_{GAIN}$ and $\Delta F_{CORNER}$, are calculated using an inverse Jacobian matrix, as shown in Equation (15):

$$\begin{bmatrix} \Delta R_{GAIN} \\ \Delta F_{CORNER} \end{bmatrix} = \begin{bmatrix} \frac{\partial |Z_{RLC}|}{\partial R_{GAIN}} & \frac{\partial |Z_{RLC}|}{\partial F_{CORNER}} \\ \frac{\partial \theta_{RLC}}{\partial R_{GAIN}} & \frac{\partial \theta_{RLC}}{\partial F_{CORNER}} \end{bmatrix}^{-1} * \begin{bmatrix} |Z_{RLC}|_{ERROR} \\ \theta_{RLC_{ERROR}} \end{bmatrix} \quad (15)$$

The filter parameters $F_{CORNER}$ and $R_{GAIN}$ of the RLC filter 222 are then updated using the calculated incremental changes, as shown in Expressions (16) and (17):

$$R_{GAIN} \leftarrow R_{GAIN} + \Delta R_{GAIN} \quad (16)$$

$$F_{CORNER} \leftarrow F_{CORNER} + \Delta F_{CORNER} \quad (17)$$

The convergence speed of Newton's method depends on the equation for which it is solving and needs to be evaluated analytically or empirically over the necessary range of values for the application. Generally, though, about 10 to 20 iterations are sufficient to determine the updated filter parameters $F_{CORNER}$ and $R_{GAIN}$ of the RLC filter 222, for example.

Once the updated filter parameters $F_{CORNER}$ and $R_{GAIN}$ have been applied to the RLC filter 222, the controller 225 switches the switch 223 to a second position (island position), such that the control circuit 220 smoothly transitions to outputting the RLC voltage $V_{RLC}$ as the amplifier control signal $V_{AMPLIFIER}$ to the AC voltage source 215 for applying the grid voltage $V_{GRID}$ to the EUT 230. This enables the electrical test circuit 210 to maintain a power island with sufficient stability for properly testing the anti-islanding capability of the EUT 230.

Figure 5A:
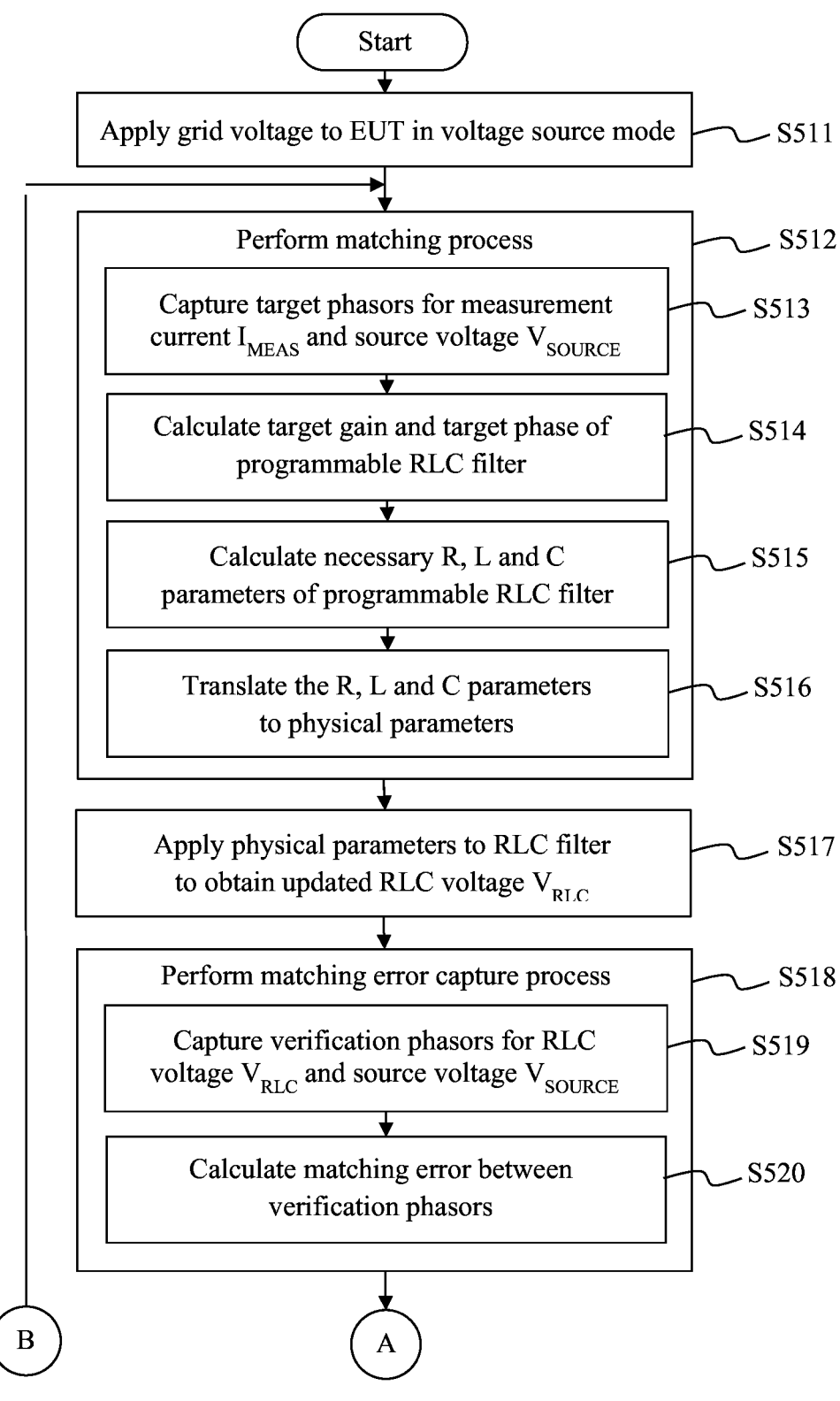
FIGS. 5A and 5B provide a flow diagram showing a method for enabling testing of sustained island capability and anti-islanding capability of an EUT, including a DC/AC inverter configured to interface a DER with an electrical grid, according to a representative embodiment.
Figure 5B:
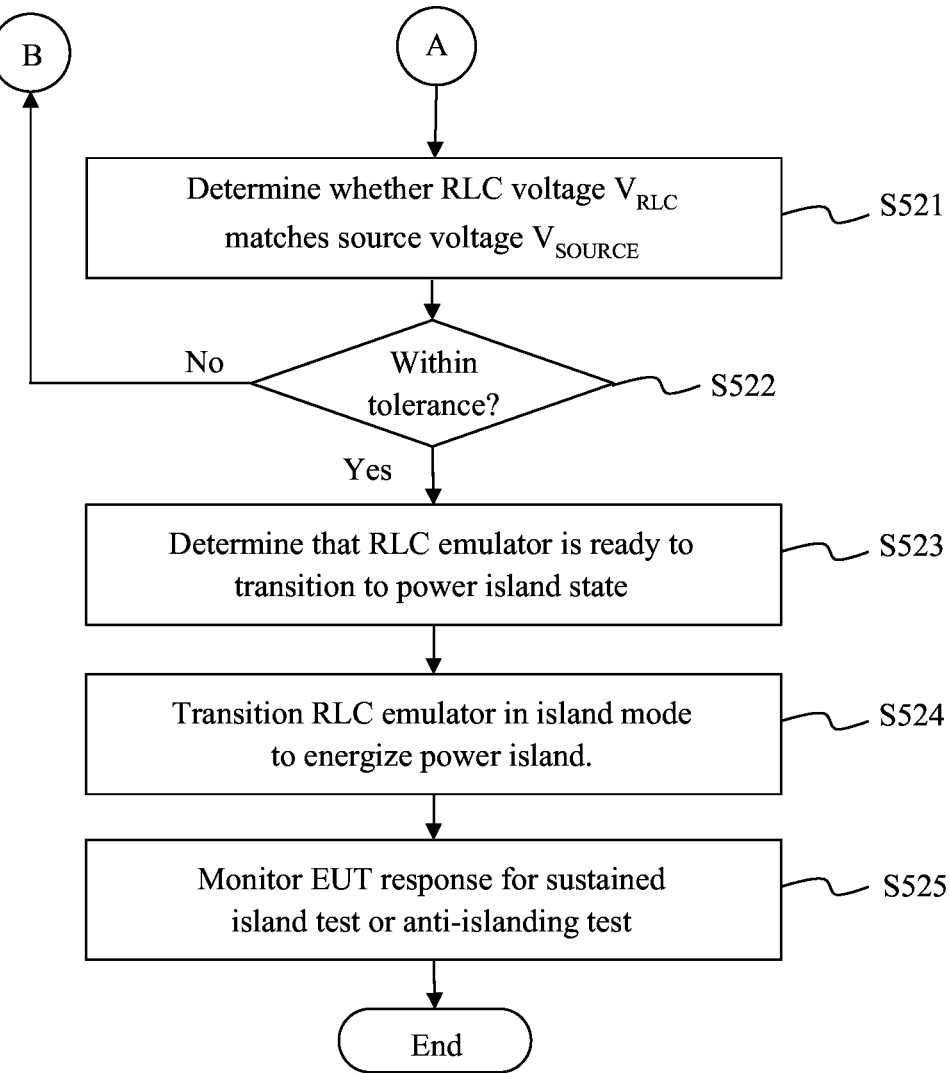

FIG. 5A is a flow diagram showing a method for enabling testing of sustained island capability and anti-islanding capability of an EUT, including a DC/AC inverter configured to interface a DER with an electrical grid, according to a representative embodiment. FIG. 5B is a continuation of the flow diagram of FIG. 5A, according to a representative embodiment. The EUT may energize a power island when the EUT (e.g., EUT 230) becomes disconnected from the electrical grid but remains connected to at least one local load drawing the same amount of power being produced by the EUT. As discussed above, the EUT includes anti-islanding capability to automatically de-energize such power islands within a predetermined maximum time period. In order to test this anti-islanding capability, the EUT must first be tested for sustained island capability to show that it is able to maintain a stable power island for a predetermined minimum time period in order to validate subsequent anti-islanding testing. The steps in FIG. 5 may be implemented using the system 200, where some or all of the steps are performed by the controller 225.

Referring to FIGS. 5A and 5B, in block S511, grid voltage $V_{GRID}$ is applied to the EUT in a voltage source mode to obtain measurement current $I_{MEAS}$ from the EUT, where the grid voltage $V_{GRID}$ emulates the electrical grid. The grid voltage $V_{GRID}$ may be generated by an AC voltage source (e.g., AC voltage source 215) initially in response to a source voltage $V_{SOURCE}$ output by a control circuit (e.g., control circuit 220). The source voltage $V_{SOURCE}$ has a predetermined value, and is output by a signal source (e.g., signal source 221), such as a sinewave generator, for example, in the control circuit. The control circuit may enter the island mode by operation of a switch (e.g., switch 223) to connect the signal source to the AC voltage source for controlling the output AC voltage. Some inverters intentionally ramp up operation slowly. Time is allowed for the EUT operation to settle, which may take seconds to minutes to occur, following application of the grid voltage $V_{GRID}$ to the EUT. Alternatively, instead of waiting for a fixed time period, the grid emulator could periodically measure the phase current and determine when it has settled to the expected final value.

In block S512, a matching process is performed to automatically calculate R, L and C (or $R_{GAIN}$, $F_{CORNER}$, and Q) parameters of the programmable RLC filter (RLC filter 222) from at least the measurement current $I_{MEAS}$ and the source voltage $V_{SOURCE}$. In the depicted embodiment, the matching process includes blocks S513 to S516 to provide physical parameters of the calculated R, L and C parameters.

In block S513, target phasors for the measurement current $I_{MEAS}$ and the source voltage $V_{SOURCE}$ are captured. The target phasors are the magnitude and phase of the measurement current $I_{MEAS}$ and the source voltage $V_{SOURCE}$. For example, the target phasor of the measurement current $I_{MEAS}(t)$ is $\tilde{I}_{MEAS}$, indicated as $|i_{MEAS}|$ and $\theta_I$, and the target phasor of the source voltage $V_{SOURCE}(t)$ is $\tilde{V}_{SOURCE}$, indicated as $|V_{SOURCE}|$ and $\theta_{SOURCE}$.

In block S514, target gain and target phase of the programmable RLC filter are calculated using the target phasors for the measurement current $I_{MEAS}$ and the source voltage $V_{SOURCE}$. That is, the target gain and the target phase may be indicated as $\tilde{Z}_{TARGET} = \tilde{V}_{SOURCE}/\tilde{I}_{MEAS}$, where $|Z_{TARGET}| = |V_{SOURCE}|/|I_{MEAS}|$ and $\theta_{TARGET} = \theta_{SOURCE} - \theta_I$, as discussed above with reference to Equations 10A-10F.

In block S515, the necessary R, L and C parameters of the RLC filter are calculated using the target gain and the target phase of the programmable RLC filter. The RLC component values are equal to the R, L and C parameters. The R, L and C parameters are determined such that $\tilde{Z}_{RLC}(R,L,C) = \tilde{Z}_{TARGET}$, where $|Z_{RLC}(RLC)| = |Z_{TARGET}|$ and $\theta_{RLC}(RLC) = \theta_{TARGET}$, as discussed above, for example, with reference to Equations (11)-(17).

In block S516, the calculated R, L and C parameters are translated to physical parameters compatible with the RLC filter. For example, the R, L and C parameters may be translated to potentiometer settings and/or digital filter coefficients that can be applied to the RLC filter. Time is allowed for the RLC filter to settle following the matching process.

For example, the matching process may be completed for a minimum time (e.g., a few seconds) before proceeding with the next step.

In block S517, the static physical parameters corresponding to the R, L and C parameters are applied to the RLC filter, along with the real-time measurement current $I_{MEAS}$ in order to obtain an updated real-time RLC voltage $V_{RLC}$.

In block S518, a matching error capture process is performed to automatically calculate matching error between the updated RLC voltage $V_{RLC}$ and the source voltage $V_{SOURCE}$. In the depicted embodiment, the matching error capture process includes blocks S519 to S520 to provide the matching error.

In block S519, verification phasors are captured from the RLC filter and the signal source for comparing the RLC voltage $V_{RLC}$ output by the RLC filter to the source voltage $V_{SOURCE}$ output by the signal source. The verification phasors are the magnitude and phase of the source voltage $V_{SOURCE}$ and the RLC voltage $V_{RLC}$ in phasor form. For example, the verification phasor of the source voltage $V_{SOURCE}(t)$ is $\tilde{V}_{SOURCE}$, indicated as $|V_{SOURCE}|$ and $\theta_{SOURCE}$, and the verification phasor of the RLC voltage $V_{RLC}(t)$ is $\tilde{V}_{RLC}$, indicated as $|V_{RLC}|$ and $\theta_{RLC}$.

In block S520, matching error between the RLC voltage $V_{RLC}$ and the source voltage $V_{SOURCE}$ is calculated. That is, the verification phasor for the RLC voltage $V_{RLC}$ is compared to the verification phasor for the source voltage $V_{SOURCE}$ to determine whether the RLC voltage $V_{RLC}$ matches the source voltage $V_{SOURCE}$ within a predetermined tolerance. For example, a matching error $\tilde{S}_{error}$ between the verification phasors $\tilde{V}_{RLC}$ and $\tilde{V}_{SOURCE}$ may be calculated according to Equation (18).

$$\tilde{S}_{error} = \frac{\tilde{V}_{RLC} - \tilde{V}_{SOURCE}}{\tilde{V}_{SOURCE}} \tag{18}$$

The magnitude of matching error $\tilde{S}_{error}$ is then compared to the predetermined tolerance in block S521 to determine in block S522 whether the RLC voltage $V_{RLC}$ is a close enough match to the source voltage $V_{SOURCE}$ to ensure a smooth transition of the EUT 230 from the grid voltage $V_{GRID}$ to the island load emulated by the RLC voltage $V_{RLC}$ to prevent triggering other system protections that may otherwise interrupt an anti-islanding test. For example, the predetermined tolerance may be less than 1 to 5 percent threshold, although other tolerances may be applied without departing from the scope of the present teachings.

Figure 6:
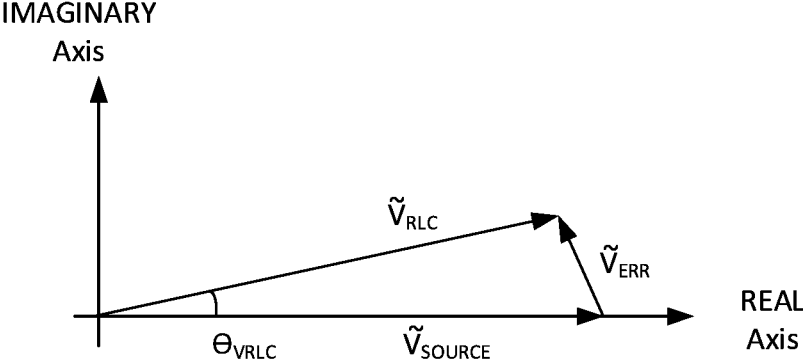
FIG. 6 is a graphical depiction of vector and trigonometric operations in the matching error capture process in FIG. 5A, according to a representative embodiment.

FIG. 6 is a graphical depiction of vector and trigonometric operations in the matching error capture process, according to a representative embodiment. Referring to FIG. 6, verification phasor $\tilde{V}_{SOURCE}$ is shown on the real axis and verification phasor $\tilde{V}_{RLC}$ is shown departing from the axis in the direction of the imaginary axis by angle $\theta_{VRLC}$. Therefore, error phasor $\tilde{V}_{ERR}$ (which is proportional to $\tilde{S}_{error}$) may be determined as the distance between the magnitudes of the verification phasors $\tilde{V}_{SOURCE}$ and $\tilde{V}_{RLC}$. Ideally, the magnitude of the error phasor $\tilde{V}_{ERR}$ would be equal to zero, although in practice, it need only be small enough so as not to trigger system protections of the EUT 230, as mentioned above. Consistent with FIG. 6, a normalized matching error may be indicated as:

$$\|\tilde{S}_{error}\| = \frac{\|\tilde{V}_{ERR}\|}{\|\tilde{V}_{SOURCE}\|}$$

Referring again to FIG. 5B, when the matching error is not within the predetermined tolerance (step S522: No), this indicates that the EUT operating point has drifted and so the process returns to block S512 to repeat the matching process and the matching error capture process. When the matching error is within the predetermined tolerance (step S522: Yes), the process proceeds to block S523, where it is determined that the EUT is ready to transition to a power island state. In other words, it is determined that the RLC voltage $V_{RLC}$ is substantially the same as the source voltage $V_{SOURCE}$, such that a subsequent transition to a power island energized by the EUT using the RLC filter with the applied RLC component values is predicted to be sufficiently smooth to avoid triggering system protections of the EUT against abnormal voltage, current and/or frequency conditions.

In block S524, the RLC voltage $V_{RLC}$ is applied to the EUT in an island mode to energize the power island. The control circuit may enter the island mode by operation of the switch to connect the RLC filter to the AC voltage source for controlling the output AC voltage. Monitoring of either the EUT's sustained island capability testing or anti-islanding capability testing, which is dependent on the setting in the EUT, is then performed in block S525. The sustained island capability is tested by the EUT seamlessly transitioning to the power island state in which a power island is energized, and then holding that energized state for a predetermined minimum time period (e.g., 10 seconds), e.g., as required by IEEE Std 1547-2018, to demonstrate stability of the power island. The anti-islanding capability is tested by the EUT seamlessly transitioning to the (stable) power island state in which a power island is energized, and then automatically de-energizing the power island within a predetermined maximum time period (e.g., 2 seconds), e.g., as required by IEEE Std 1547-2018, to demonstrate effectiveness of the anti-islanding capability.

As mentioned above, for ease of illustration, one line circuit 201 of the system 200, corresponding to one phase of a three-phase electrical power grid, is shown in detail, for example. It is understood that line circuits 202 and 203 of the three-phase electrical power grid in the system 200 have substantially the same implementation as the line circuit 201 for providing three-phase electrical power to the EUT 230. In this case, there are three independent electrical test circuit 210 and control circuit 220 combinations for the three line circuits 201, 202 and 203, each of which is connected to the EUT 230 at a corresponding terminal. Generally, the switches 223 line circuits 201, 202 and 203 may be switched at the same time when all three lines are matched.

Figure 7:
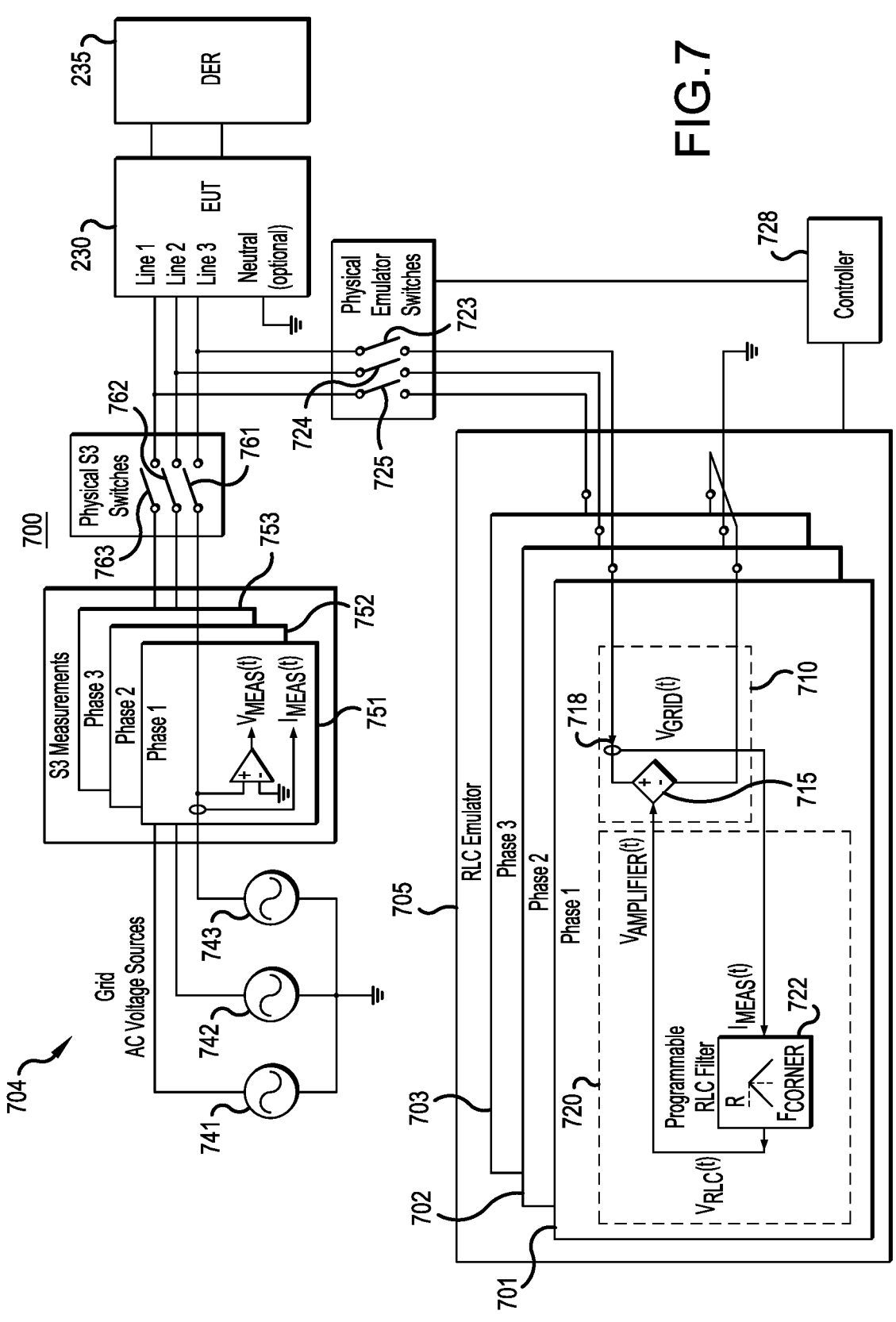
FIG. 7 is a simplified block diagram showing a system with separate electrical test and control circuits for enabling testing of sustained island capability and anti-islanding capability of an EUT, including a DC/AC inverter configured to interface a DER with an electrical grid and an emulated RLC circuit, according to a representative embodiment.

In an alternative embodiment, the electrical test circuit and the control circuit are separate from one another. In this regard, FIG. 7 is a simplified block diagram showing a system with separate electrical test and control circuits for enabling testing of sustained island capability and anti-islanding capability of EUT, according to a representative embodiment. That is, FIG. 7 shows a DC/AC inverter configured to interface a DER with an electrical grid and an emulated RLC circuit.

Referring to FIG. 7, system 700 includes a three-phase electrical power grid 704 and an RLC emulator 705 for emulating three-phase electrical voltage for testing the EUT 230, including sustained island and anti-islanding testing. The electrical power grid 704 includes AC voltage sources 741, 742 and 743, measurement circuits 751, 752 and 753, and physical S3 switches 761, 762 and 763 corresponding to the three phases, Phase 1, Phase 2 and Phase 3, respectively. The source voltages generated by the AC voltage sources 741, 742 and 743 are selectively applied to corresponding terminals of the EUT 230 by operation of the S3 switches 761, 762 and 763, respectively. The AC voltage sources 741, 742 and 743 may be sinewave generators, for example. The RLC emulator 705 includes line circuits 701, 702 and 703 corresponding to the three phases, Phase 1, Phase 2 and Phase 3, respectively, of the electrical power grid 704. For the sake of convenience, only the portions of the system 700 associated with Phase 1 are described below, although it is understood that the portions of the system 700 associated with Phases 2 and 3 are substantially the same. However, as mentioned above, the discussion herein also applies to a one-phase (e.g., Phase 1) emulated power grid.

Referring to Phase 1, the RLC emulator 705 includes electrical circuit 710 and control circuit 720 configured to control operation the electrical circuit 710. The electrical circuit 710 includes AC voltage source 715 and a current transducer 718. The AC voltage source 715 is configured to output an AC grid voltage $V_{GRID}$ under control of the control circuit 720. The AC voltage source 715 may include a power amplifier configured to adjust the AC voltage signal to a desired amplitude and phase in response to an amplifier control signal $V_{AMPLIFIER}$ output by the control circuit 720 in order to provide the grid voltage $V_{GRID}$. The amplifier control signal $V_{AMPLIFIER}$ may be a digital signal or a low voltage analog signal, for example. The grid voltage $V_{GRID}$ output by the AC voltage source 715 may be selectively applied to a corresponding terminal of the EUT 230 by operation of physical emulator switch 723, resulting in measurement current $I_{MEAS}$, which is provided to the control circuit 720 via the current transducer 718. The grid voltages $V_{GRID}$ output by AC voltage sources in the other line circuits 702 and 703 likewise may be selectively applied to corresponding terminals of the EUT 230 by operation of physical emulator switches 724 and 725, respectively. Generally, the emulator switches 723, 724 and 725 are configured to disconnect the RLC emulator 705 from the EUT 230 while target phasor measurements are being captured in the measurement circuits 751, 752 and 753 and to connect the RLC emulator 705 to the EUT 230 once these measurements are complete. The S3 switches 761, 762 and 763 are configured to connect the electrical power grid 704 to the EUT 230 in the voltage source mode and to disconnect the electrical power grid 704 from the EUT 230 in the island mode.

The control circuit 720 includes a programmable RLC filter 722 configured to provide an RLC voltage $V_{RLC}$, which is determined in response to measurement current $I_{MEAS}$ received from the electrical circuit 710. The RLC voltage $V_{RLC}$ is output as the amplifier control signal $V_{AMPLIFIER}$ to the AC voltage source 715. The setting of parameters of the RLC filter 722, as well as operation of the emulator switches 723, 724 and 725 and the S3 switches 761, 762 and 763 are controlled by a controller 728, an example of which is described in more detail below with reference to FIG. 8.

Similar to the description of FIG. 2, grid voltage $V_{GRID}$ is applied to the EUT 230 in the voltage source mode by closing the S3 switch 761 to obtain measurement current $I_{MEAS}$ and measurement voltage $V_{MEAS}$ from the EUT 230. The matching process may be performed to calculate the necessary R, L and C parameters and the corresponding physical parameters of the RLC filter 722, as discussed above with reference to blocks S512 to S516 in FIG. 5A. Notably, though, prior to capturing target phasors for the measurement current $I_{MEAS}$ and the source voltage $V_{SOURCE}$ (e.g., block S513), the electrical circuit 710 must be disconnected from the EUT 230 by opening the emulator switch 723 so that the measurement circuit 751 (and measurement circuits 752 and 75) receive the full EUT current during the target phasor capture process. That is, the target phasors are obtained from the measurement current $I_{meas}$ and the measurement voltage $V_{meas}$ from the measurement circuit 751. Then, once the R, L and C parameters are translated to physical parameters (e.g., block S516), the electrical circuit 710 is connected to the EUT 230 by closing the emulator switch 723. Performing the matching error capture process is different from the previous embodiment, as it is based on current, rather than voltage. For example, in phase 1 the relative matching error is the amplitude of the current through the S3 switch 751 divided by the amplitude of the EUT current, which was captured during the target phasor capture, as follows:

$$\|\tilde{S}_{error}\| = \frac{\|I_{MEAS}(\text{MATCHING ERROR CAPTURE})\|}{\|i_{MEAS}(\text{MATCHING PROCESS})\|}$$

Once the matching error is within the acceptable tolerance, physical switches 761, 763, and 763 are configured to disconnect the electrical power grid 704 and thus create the power island.

Figure 8:
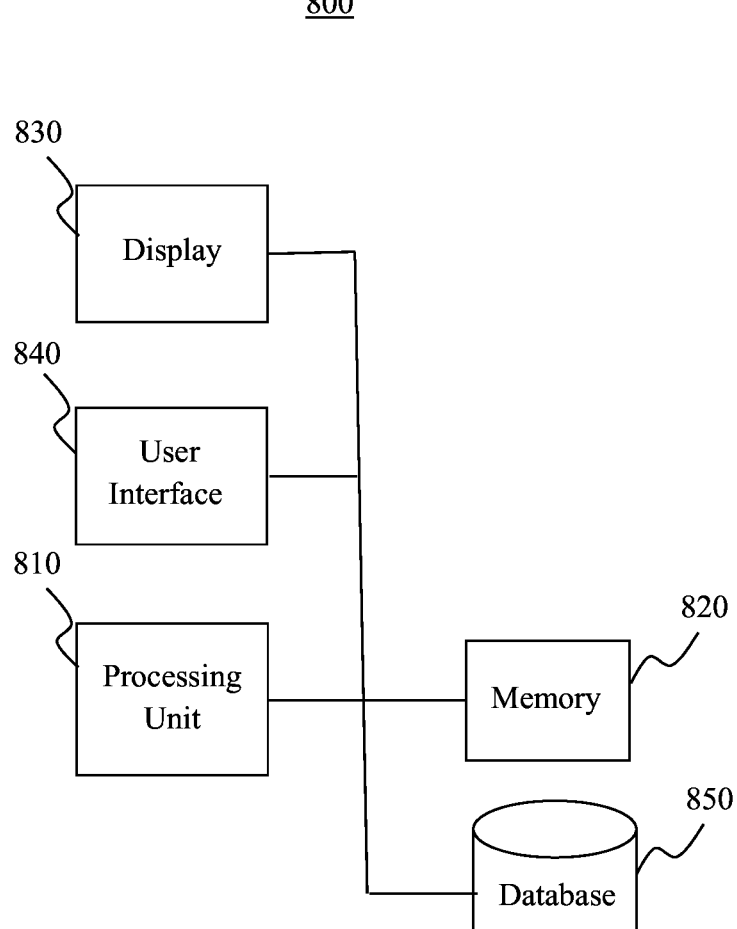
FIG. 8 is a simplified block diagram of a representative controller, according to a representative embodiment.

FIG. 8 is a simplified block diagram of a representative controller, such as the controller 225 in FIG. 2 and controller 728 in FIG. 7, according to a representative embodiment.

Referring to FIG. 8, controller 800 includes a processing unit 810, memory 820 for storing instructions executable by the processing unit 810 to implement the processes described herein, as well as a display 830 and an interface 840 to enable user interaction. The processing unit 810 may access a database 850 that stores information to be used for testing, for example. The term "controller" broadly encompasses all structural configurations, as understood in the art of the present disclosure and as exemplarily described in the present disclosure, of an application specific main board or an application specific integrated circuit for controlling application of various principles as described in the present disclosure. The structural configuration of the controller 800 may include, but is not limited to, processor(s), computer-usable/computer readable storage medium(s), an operating system, application module(s), peripheral device controller(s), slot(s) and port(s), as discussed below.

The processing unit 810 is representative of one or more processing devices, and is configured to execute software instructions to perform functions as described in the various embodiments herein. The processing unit 810 may be implemented by a general purpose computer, a central processing unit, one or more processors, microprocessors or microcontrollers, a state machine, a programmable logic device, field programmable gate arrays (FPGAs), application specific integrated circuits (ASICs), or combinations thereof, using any combination of hardware, software, firmware, hardwired logic circuits, or combinations thereof. The term "processor," in particular, encompasses an electronic component able to execute a program or machine executable instructions. References to a processor should be interpreted to include more than one processor or processing core, as in a multi-core processor, and/or parallel processors. Programs have software instructions performed by one or multiple processors that may be within the same computing device or which may be distributed across multiple computing devices.

The memory 820 may include a main memory and/or a static memory, where such memories may communicate with each other and the processing unit 810 via one or more buses. The memory 820 stores instructions used to implement some or all aspects of methods and processes described herein, including the methods described above with reference to FIG. 8, for example. The memory 820 may be implemented by any number, type and combination of random access memory (RAM) and read-only memory (ROM), for example, and may store various types of information, such as software algorithms, data based models including neural network based models, and computer programs, all of which are executable by the processing unit 810. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art.

The memory 820 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term non-transitory specifically disavows fleeting characteristics such as characteristics of a carrier wave or signal or other forms that exist only transitorily in any place at any time. The memory 820 may store software instructions and/or computer readable code that enable performance of various functions. The memory 820 may be secure and/or encrypted, or unsecure and/or unencrypted.

Similarly, the database 850 may be implemented by any number, type and combination of RAM and ROM, for example, discussed above, The database 850 likewise is a tangible storage medium for storing data and executable software instructions, and is non-transitory during the time software instructions are stored therein. The database 850 may be secure and/or encrypted, or unsecure and/or unencrypted.

"Memory" is an example of computer-readable storage media, and should be interpreted as possibly being multiple memories or databases. The memory or database may for instance be multiple memories or databases local to the computer, and/or distributed amongst multiple computer systems or computing devices. A computer readable storage medium is defined to be any medium that constitutes patentable subject matter under 35 U.S.C. § 101 and excludes any medium that does not constitute patentable subject matter under 35 U.S.C. § 101. Examples of such media include non-transitory media such as computer memory devices that store information in a format that is readable by a computer or data processing system. More specific examples of non-transitory media include computer disks and non-volatile memories.

The display 830 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 830 may also provide a graphical user interface (GUI) for displaying and receiving information to and from the user.

The interface 840 may include a user and/or network interface for providing information and data output by the processing unit 810 and/or the memory 820 to the user and/or for receiving information and data input by the user. That is, the interface 840 enables the user to enter data and to control or manipulate aspects of the processes described herein, and also enables the processing unit 810 to indicate the effects of the user's control or manipulation. The interface 840 may connect one or more user interfaces, such as a mouse, a keyboard, a mouse, a trackball, a joystick, a haptic device, a microphone, a video camera, a touchpad, a touchscreen, voice or gesture recognition captured by a microphone or video camera, for example, or any other peripheral or control to permit user feedback from and interaction with the processing unit 810. The interface 840 may further include one or more of ports, disk drives, wireless antennas, or other types of receiver circuitry.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of testing sustained and anti-islanding capabilities of Equipment Under Test (EUT), wherein the EUT is a DC/AC inverter configured to interface a distributed energy resource (DER) with an electrical grid, wherein the EUT energizes a power island when the EUT becomes disconnected from the electrical grid but remains connected to at least one local load drawing the same amount of power being produced by the EUT, and wherein the power island is sustained for a predetermined minimum time period without anti-islanding functionality in the EUT or becomes de-energized within a predetermined maximum time period with the anti-islanding functionality in the EUT, the method comprising:

applying grid voltage ($V_{GRID}$) to the EUT in a voltage source mode to obtain measurement current ($I_{MEAS}$) from the EUT, wherein the grid voltage ($V_{GRID}$) emulates the electrical grid;

automatically calculating RLC component values of a programmable RLC filter from at least the measurement current ($I_{MEAS}$), wherein calculating the RLC component values comprises:

calculating target gain and target phase of the programmable RLC filter;

calculating target R, L and C parameters of the programmable RLC filter using the target gain and the target phase of the programmable RLC filter, wherein the RLC component values are equal to the R, L and C parameters; and translating the target R, L and C parameters to physical parameters compatible with the programmable RLC filter;

applying the physical parameters and the measurement current ($I_{MEAS}$) to the programmable RLC filter to obtain RLC voltage ($V_{RLC}$);

comparing the RLC voltage ($V_{RLC}$) to a source voltage ($V_{SOURCE}$);

when the RLC voltage ($V_{RLC}$) is substantially the same as the source voltage ($V_{SOURCE}$), predicting that a subsequent transition to a power island energized by the EUT with the programmable RLC filter having the applied RLC component values will be sufficiently smooth to avoid triggering system protections of the EUT against abnormal voltage, current and/or frequency conditions;

applying the RLC voltage ($V_{RLC}$) to the EUT in an island mode to energize the power island; and testing an ability of the EUT to sustain the power island for the predetermined minimum time period with the anti-islanding functionality disabled or to detect and de-energize the power island within the predetermined maximum time period when the anti-islanding functionality is enabled.

2. The method of claim 1, wherein calculating the RLC component values of the programmable RLC filter further comprises:

capturing target magnitudes and target phases of the measurement current ($I_{MEAS}$) and the source voltage ($V_{SOURCE}$), wherein the target gain and the target phase of the programmable RLC filter are calculated using the target magnitudes and target phases of the measurement current ($I_{MEAS}$) and the source voltage ($V_{SOURCE}$).

3. The method of claim 1, wherein comparing the RLC voltage to the source voltage comprises:

capturing verification magnitudes and verification phases of the source voltage ($V_{SOURCE}$) and the RLC voltage ($V_{RLC}$);

calculating a relative matching error between the verification magnitude and the verification phase of the source voltage ($V_{SOURCE}$) and the verification magnitude and the verification phase of the RLC voltage ($V_{RLC}$); and comparing the relative matching error to a predetermined desired tolerance, wherein the subsequent transition to the power island energized by the EUT is predicted to be sufficiently smooth when the relative matching error is within the predetermined desired tolerance.

4. The method of claim 3, wherein the predetermined desired tolerance is a 2 percent threshold.

5. The method of claim 1, wherein the subsequent transition to the power island energized by the EUT is predicted to be sufficiently smooth when the RLC voltage ($V_{RLC}$) is substantially the same as the source voltage ($V_{SOURCE}$).

6. The method of claim 1, wherein the predetermined minimum time period for the power island to remain energized without the anti-islanding functionality is 10 seconds and the predetermined maximum time period for the power island to become de-energized with the anti-islanding functionality is 2 seconds.

7. A system for testing sustained and anti-islanding capabilities of Equipment Under Test (EUT), wherein the EUT is a DC/AC inverter configured to interface a distributed energy resource (DER) with an electrical grid, wherein the EUT energizes a power island when the EUT becomes disconnected from the electrical grid but remains connected to at least one local load drawing the same amount of power being produced by the EUT, and wherein the power island is sustained for a predetermined minimum time period without anti-islanding functionality in the EUT or becomes de-energized within a predetermined maximum time period with the anti-islanding functionality in the EUT, the system comprising:

a programmable RLC filter configured to provide an RLC voltage ($V_{RLC}$);

an AC voltage source configured to generate grid voltage ($V_{GRID}$), wherein the grid voltage ($V_{GRID}$) emulates the electrical grid to the EUT; and a controller comprising a processing unit and a non-transitory memory storing instructions that, when executed by the processing unit, cause the processing unit to:

obtain measurement current ($I_{MEAS}$) from the EUT with in a voltage source mode for applying the grid voltage ($V_{GRID}$) to the EUT;

automatically calculate RLC component values of the programmable RLC filter from at least the measurement current ($I_{MEAS}$), wherein calculating the RLC component values comprises:

calculating target gain and target phase of the programmable RLC filter;

calculating target R, L and C parameters of the programmable RLC filter using the target gain and the target phase of the programmable RLC filter, wherein the RLC component values are equal to the R, L and C parameters; and translating the target R, L and C parameters to physical parameters compatible with the programmable RLC filter;

apply the physical parameters and the measurement current ($I_{MEAS}$) to the programmable RLC filter to obtain the RLC voltage ($V_{RLC}$);

compare the RLC voltage ($V_{RLC}$) to a source voltage ($V_{SOURCE}$);

when the RLC voltage ($V_{RLC}$) is substantially the same as the source voltage ($V_{SOURCE}$), predict that a subsequent transition to a power island energized by the EUT with the programmable RLC filter having the applied RLC component values will be sufficiently smooth to avoid triggering system protections of the EUT against abnormal voltage, current and/or frequency conditions; and apply the RLC voltage ($V_{RLC}$) to the EUT in an island mode for energizing the power island for testing an ability of the EUT to sustain the power island for the predetermined minimum time period with the anti-islanding functionality disabled or to detect and de-energize the power island within the predetermined maximum time period when the anti-islanding functionality is enabled.

8. The system of claim 7, wherein the instructions further cause the processing unit to calculate the RLC component values of the programmable RLC filter by:

capturing target magnitudes and target phases of the measurement current ($I_{MEAS}$) and the source voltage ($V_{SOURCE}$), wherein the target gain and the target phase of the programmable RLC filter are calculated using the target magnitudes and the target phases of the measurement current ($I_{MEAS}$) and source voltage ($V_{SOURCE}$).

9. The wherein of claim 7, wherein the instructions cause the processing unit to compare the RLC voltage to the source voltage by:

capturing verification magnitudes and verification phases of the source voltage ($V_{SOURCE}$) and the RLC voltage ($V_{RLC}$);

calculating a relative matching error between the verification magnitude and the verification phase of the source voltage ($V_{SOURCE}$) and the verification magnitude and the verification phase of the RLC voltage ($V_{RLC}$); and comparing the relative matching error to a predetermined desired tolerance, wherein the subsequent transition to the power island energized by the EUT is predicted to be sufficiently smooth when the relative matching error is within the predetermined desired tolerance.

10. The system of claim 7, wherein the subsequent transition to the power island energized by the EUT is predicted to be sufficiently smooth when the RLC voltage ($V_{RLC}$) is substantially the same as the source voltage ($V_{SOURCE}$).

11. The system of claim 7, wherein the predetermined minimum time period for the power island to remain energized without the anti-islanding functionality is 10 seconds, and the predetermined maximum time period for the power island to become de-energized with the anti-islanding functionality is 2 seconds.

12. The system of claim 7, further comprising:

an emulator switch configured to switch between a voltage source position to provide the voltage source mode for applying the grid voltage ($V_{GRID}$) to the EUT and an island position to provide the island mode for energizing the power island.

13. The system of claim 12, wherein the emulator switch is configured to selectively connect the source voltage ($V_{SOURCE}$) or the RLC voltage ($V_{RLC}$) to the AC voltage source.

14. The system of claim 12, wherein the emulator switch is configured to selectively connect the AC voltage source to the EUT.

15. A non-transitory computer readable medium storing instructions for testing sustained and anti-islanding capabilities of Equipment Under Test (EUT), wherein the EUT is a DC/AC inverter configured to interface a distributed energy resource (DER) with an electrical grid, wherein the EUT energizes a power island when the EUT becomes disconnected from the electrical grid but remains connected to at least one local load drawing the same amount of power being produced by the EUT, and wherein the power island is sustained for a predetermined minimum time period without anti-islanding functionality in the EUT or becomes de-energized within a predetermined maximum time period with the anti-islanding functionality in the EUT, wherein when executed by a processing unit, the instructions cause the processing unit to:

obtain measurement current ($I_{MEAS}$) from the EUT in a voltage source mode in which grid voltage ($V_{GRID}$) generated by an AC voltage source is applied to the EUT for emulating the electrical grid, wherein the grid voltage ($V_{GRID}$) emulates the electrical grid;

automatically calculate RLC component values of an RLC filter, configured to output an RLC voltage ($V_{RLC}$), from at least the measurement current ($I_{MEAS}$), wherein automatically calculating the RLC component values comprises:

calculating target gain and target phase of the RLC filter;

calculating target R, L and C parameters of the RLC filter using the target gain and the target phase of the RLC filter, wherein the RLC component values are equal to the R, L and C parameters; and translating the target R, L and C parameters to physical parameters compatible with the RLC filter;

apply the physical parameters and the measurement current ($I_{MEAS}$) to the RLC filter to obtain the RLC voltage ($V_{RLC}$);

compare the RLC voltage ($V_{RLC}$) to a source voltage ($V_{SOURCE}$);

when the RLC voltage ($V_{RLC}$) is substantially the same as the source voltage ($V_{SOURCE}$), predict that a subsequent transition to a power island energized by the EUT with the RLC filter having the applied RLC component values will be sufficiently smooth to avoid triggering system protections of the EUT against abnormal voltage, current and/or frequency conditions; and switch to an island mode to apply the RLC voltage ($V_{RLC}$) to the EUT for energizing the power island, wherein an ability of the EUT to sustain the power island for the predetermined minimum time period with the anti-islanding functionality disabled or to detect and de-energize the power island within the predetermined maximum time period when the anti-islanding functionality is enabled is tested in the island mode.

16. The computer readable medium of claim 15, wherein the instructions further cause the processing unit to calculate the RLC component values of the RLC filter by:

capturing target magnitudes and target phases of the measurement current ($I_{MEAS}$) and the source voltage ($V_{SOURCE}$), wherein the target gain and the target phase of the RLC filter are calculated using the target magnitudes and the target phases of the measurement current ($I_{MEAS}$) and source voltage ($V_{SOURCE}$).

17. The computer readable medium of claim 15, wherein the instructions cause the processing unit to compare the RLC voltage to the source voltage by:

capturing verification magnitudes and verification phases of the source voltage ($V_{SOURCE}$) and the RLC voltage ($V_{RLC}$);

calculating a relative matching error between the verification magnitude and the verification phase of the source voltage ($V_{SOURCE}$) and the verification magnitude and the verification phase of the RLC voltage ($V_{RLC}$); and comparing the relative matching error to a predetermined desired tolerance, wherein the subsequent transition to the power island energized by the EUT is predicted to be sufficiently smooth when the relative matching error is within the predetermined desired tolerance.

18. The computer readable medium of claim 17, wherein the predetermined desired tolerance is a 2 percent threshold.

19. The computer readable medium of claim 15, wherein the subsequent transition to the power island energized by the EUT is predicted to be sufficiently smooth when the RLC voltage ($V_{RLC}$) is substantially the same as the source voltage ($V_{SOURCE}$).

20. The computer readable medium of claim 15, wherein the predetermined minimum time period for the power island to remain energized without the anti-islanding functionality is 10 seconds, and wherein the predetermined maximum time period for the power island to become de-energized with the anti-islanding functionality is 2 seconds.

* * * * *